US011001599B2

(12) United States Patent
Arkles et al.

(10) Patent No.: US 11,001,599 B2
(45) Date of Patent: May 11, 2021

(54) N-ALKYL SUBSTITUTED CYCLIC AND OLIGOMERIC PERHYDRIDOSILAZANES, METHODS OF PREPARATION THEREOF, AND SILICON NITRIDE FILMS FORMED THEREFROM

(71) Applicant: Gelest Technologies, Inc., Morrisville, PA (US)

(72) Inventors: Barry C. Arkles, Pipersville, PA (US); Youlin Pan, Langhorne, PA (US); Fernando Jove, Collingswood, NJ (US)

(73) Assignee: GELEST TECHNOLOGIES, INC., Morrisville, NJ (US)

(\*) Notice: Subject to any disclaimer, the term of this patent is extended or adjusted under 35 U.S.C. 154(b) by 0 days.

(21) Appl. No.: 15/070,693

(22) Filed: Mar. 15, 2016

(65) Prior Publication Data

US 2016/0280724 A1 Sep. 29, 2016

Related U.S. Application Data

(60) Provisional application No. 62/136,916, filed on Mar. 23, 2015.

(51) Int. Cl.
| | | |
|---|---|---|
| *C07F 7/21* | (2006.01) | |
| *H01L 21/02* | (2006.01) | |
| *C01B 21/068* | (2006.01) | |
| *C07F 7/02* | (2006.01) | |
| *C08G 77/62* | (2006.01) | |

(52) U.S. Cl.
CPC .............. *C07F 7/21* (2013.01); *C01B 21/068* (2013.01); *C07F 7/025* (2013.01); *C08G 77/62* (2013.01); *H01L 21/0217* (2013.01); *H01L 21/02219* (2013.01); *H01L 21/02222* (2013.01); *H01L 21/02271* (2013.01); *H01L 21/02274* (2013.01)

(58) Field of Classification Search
CPC ........... C07F 7/21; C07F 7/025; C01B 21/068
See application file for complete search history.

(56) References Cited

U.S. PATENT DOCUMENTS

| | | | |
|---|---|---|---|
| 4,200,666 A | | 4/1980 | Reinberg |
| 4,595,775 A | * | 6/1986 | Arkles ...................... C07F 7/21 501/88 |
| 5,008,422 A | * | 4/1991 | Blum ...................... C04B 35/16 556/402 |
| 6,586,056 B2 | | 7/2003 | Arkles et al. |
| 9,809,608 B2 | * | 11/2017 | Jang .......................... C07F 7/21 |
| 2011/0256734 A1 | | 10/2011 | Hausmann et al. |
| 2014/0051264 A1 | * | 2/2014 | Mallick ............. H01L 21/02337 438/786 |

FOREIGN PATENT DOCUMENTS

EP 2644609 A2 10/2013

OTHER PUBLICATIONS

Breed (Inorganic Chemistry; 1964, vol. 3 (11), 1622-1627).*
Fleischer (Z. Anorg. Allg. Che. 1999, 625, 313-320).*
Semenova (pp. 1945-1947; translated from Izvestiya Academii Nauk, SSSR, Ordelenie Khimicheskikh Nauk, No. 11, 2036-2039, 1962).*
Yu (Journal of Material Science, vol. 29, No. 6, 1680-1685, 1994).*
Int'l Search Report and Written Opinion dated Jun. 10, 2016 in Int'l Application No. PCT/US2016/022916.
Cyclic Precursors for Gap Fill Depositions, Prior Art Database, Mar. 11, 2010, downloaded from web page: http://priorartdatabase.com/ PCOM/000193876, Download Date: Aug. 4, 2016, original posting date: unknown, 14 pages.
Cyclic Precursors for Gap Fill Depositions of SiO2 in Trenches in Microelectronics Fabrication using Silicon Containing Compounds, Mar. 11, 2010, downloaded from web page: IP.com, Download date: May 19, 2016, original posting date: unknown, 45 pages.
Int'l Preliminary Report on Patentability dated Oct. 5, 2017 in Int'l Application No. PCT/US2016/022916.
Hochberg, et al. Diethylsilane as a Silicon Source for the Deposition of Silicon Nitride and Silicon Oxynitride Films by LPCVD. MRS Proceedings, 204, 509-514 (1991).
Arkles. Silicon Nitride from Organosilazane Cyclic and Linear Prepolymers. Journal of the Electrochemical Society; 133(1); p. 233-234 (1986).
Tanaka, et al. Film Properties of Low-k Silicon Nitride Films Formed by Hexachlorodisilane and Ammonia. Journal of the Electrochemical Society; 147(6); p. 2284-2289 (2000).
Gumpher et al. Characterization of Low-Temperature Silicon Nitride LPCVD from Bis(tertiary-butylamino)silane and Ammonia. Journal of the Electrochemical Society; 151(5); G353-G359 (2004).
Rayez, et al. Structures and Si-N bond strengths of some cyclodi- and cyclotrisilazanes. Journal of Molecular Structure (Theochem); 487; p. 241-250 (1999).
Office Action dated Jul. 9, 2018 in EP Application No. 16714133.2.
Office Action dated Oct. 15, 2018 in EP Application No. 16714133. 2.
Isoda et al., "Perhydropolysilazane Precursors to Silicone Nitride Ceramics," Journal of Inorganic and Organometallic Polymers, vol. 2, No. 1, pp. 151-160 (1992).

\* cited by examiner

*Primary Examiner* — Pancham Bakshi
(74) *Attorney, Agent, or Firm* — Panitch Schwarze Belisario & Nadel LLP

(57) ABSTRACT

Novel N-alkyl substituted perhydridocyclic silazanes, oligomeric N-alkyl perhydridosilazane compounds, and N-alkylaminodihydridohalosilanes, and a method for their synthesis are provided. The novel compounds may be used to form high silicon nitride content films by thermal or plasma induced decomposition.

5 Claims, 2 Drawing Sheets

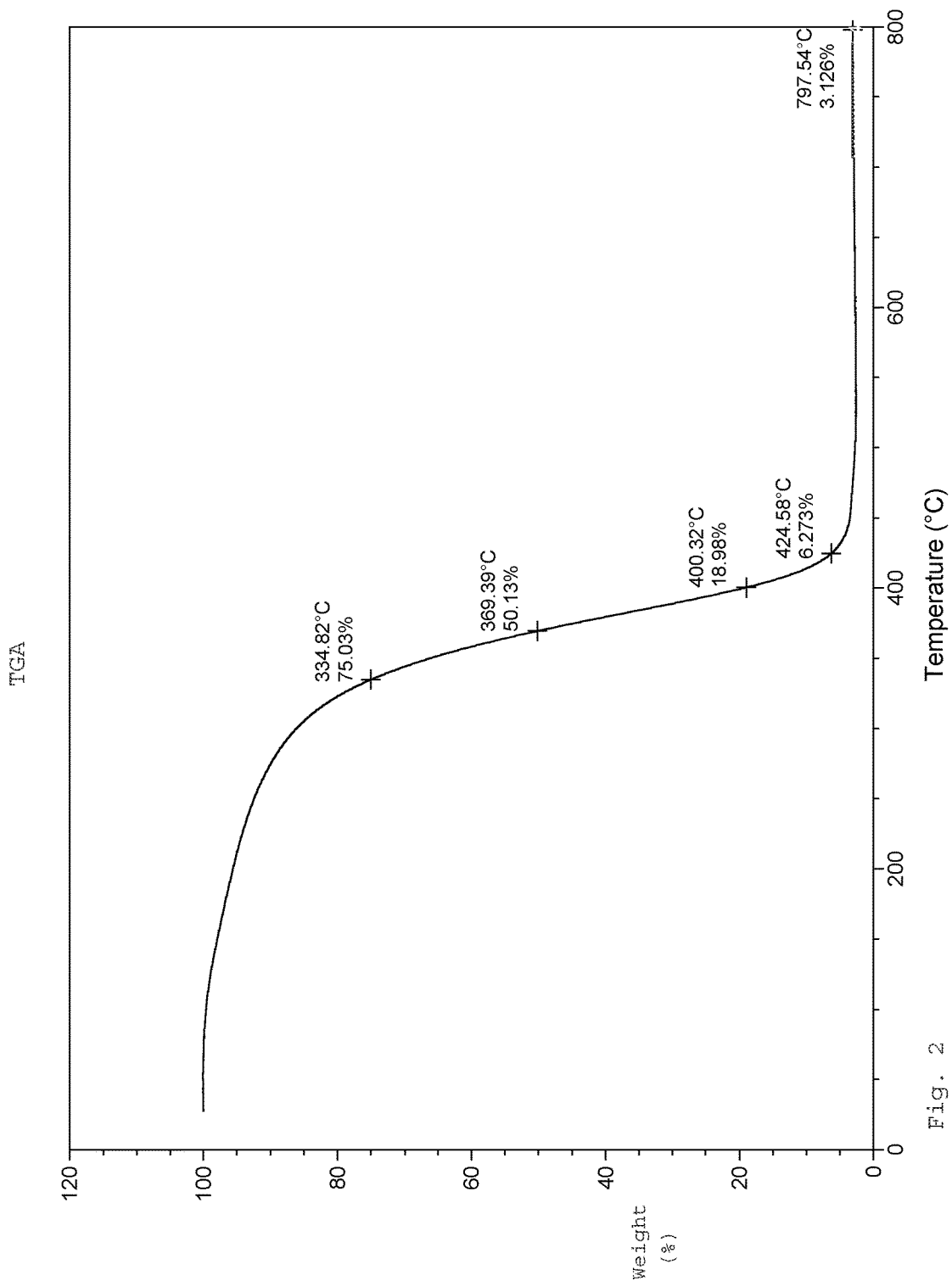

N-ALKYL SUBSTITUTED CYCLIC AND OLIGOMERIC PERHYDRIDOSILAZANES, METHODS OF PREPARATION THEREOF, AND SILICON NITRIDE FILMS FORMED THEREFROM

CROSS REFERENCE TO RELATED APPLICATION

This application claims priority to U.S. Provisional Patent Application No. 62/136,916, filed Mar. 23, 2015, the disclosure of which is herein incorporated by reference.

BACKGROUND OF THE INVENTION

The low coefficient of thermal expansion and relatively low dielectric constant of silicon nitride (SiN) in its various forms has led to a wide range of thin films applications in semiconductor, display, photovoltaic and structural composite applications. The silicon nitride may range from amorphous to various crystalline forms and can include carbon doped materials or "silicon carbonitrides." The most widely used manufacturing technologies for producing these films use the reaction of silicon precursors of silane ($SiH_4$) or dichlorosilane ($H_2SiCl_2$) with ammonia ($NH_3$) under thermal- or plasma-assisted low-pressure chemical vapor deposition (LPCVD), sub-atmospheric pressure CVD (SACVD), or atmospheric pressure CVD (APCVD). Unfortunately, plasma assistance necessitates temperatures in excess of 750° C. and thermal deposition processes require temperatures in excess of 1000° C. Plasma use also leads, in many cases, to the incorporation of excessive concentrations of hydrogen species, thus limiting the quality of the resulting SiN thin films.

The use of these inorganic precursor-based thermal and plasma CVD technologies precludes their use for preparation on substrates that are sensitive to high temperature or highly energetic environments. Their use also requires stringent safety precautions as they can be pyrophoric, toxic, corrosive, or present other hazards. Further, particulate generation in the CVD reactor, resulting from the reaction of chloro or other halo-silane type chemistries with ammonia, poses significant tool reliability problems. Therefore, there is a need in the art for an alternative to the use of silanes and chlorosilanes as raw materials and a need in the art for a CVD process which does not require plasma.

Alternatives to inorganic CVD techniques have been proposed, but such processes require difficult-to-access intermediates, use a high energy environment, and/or result in a film in which the electrical properties are compromised. Examples of such alternative systems include that described in U.S. Pat. No. 4,200,666 using trisilylamine (($SiH_3$)$_3$N) and an inert gas with optional ammonia; the system of diethylsilane and ammonia in an LPCVD system at 800° C., as described in A. Hochberg et al. (*Mat. Res. Soc. Symp*, 204, 509-514 (1991)); and the system of cyclic silazanes and ammonia in a chemical vapor deposition (CVD) process described by B. Arkles (*J. Electrochemical Soc.*, Vol. 133, No. 1, pp. 233-234 (1986)).

More recently, halide-containing precursors such as tetraiodosilane and hexachlorodisilane have been described in U.S. Pat. No. 6,586,056 and by M. Tanaka et al. (J. Electrochemical Society, 147, 2284 (2000)), respectively. Unfortunately, there are operational difficulties associated with the corrosiveness of the precursors, as well as with film contaminants and byproducts.

Another approach is the use of bis(t-butylamino)silane, which produces SiN films of reasonable quality at temperatures as low as 550° C. (J. Gumpher et al., *J. Electrochem. Soc.*, 151, G353 (2004)) or in a plasma-assisted pulsed deposition method as described in U.S. Patent Application Publication No. 2011/0256734. In both cases, there are complications with carbon contamination of films and the high energy requirements of both the thermal and plasma regimes, which are not compatible with substrate stability. A review of other alternative approaches is found in EP 2 644 609 A2, which suggests fluorinated precursors. While such fluorinated precursors theoretically allow lower deposition temperatures, the introduced fluorine frequently affects electrical properties of silicon based structures. Thus, the need for new SiN precursors which are able to deposit silicon nitrides at low temperature has still not been satisfied.

Perhydridocyclic silazanes with methyl substitution on the nitrogen have been contemplated in the literature by M. Rayez et al., (*J. Molecular Structure*, 487(3), 241-250, (1999)) and in U.S. Patent Application Publication No. 2014/0051264. However, the methyl substitution does not allow a mechanism for low temperature deposition by an elimination reaction.

SUMMARY OF THE INVENTION

An N-alkyl substituted perhydridocyclic silazane according to an embodiment of the invention has formula (1), (2), or (3):

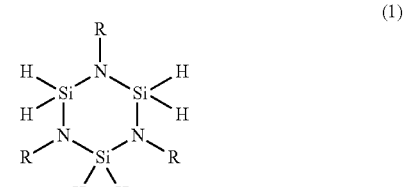

(1)

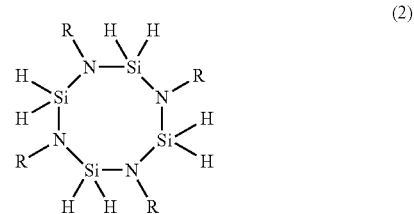

(2)

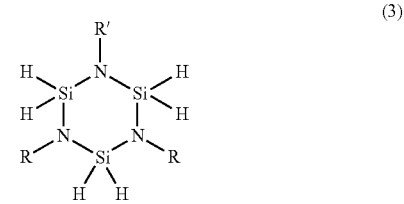

(3)

wherein each R is independently a linear or branched alkyl group having two to about ten carbon atoms, and wherein R' is hydrogen or a linear or branched alkyl group having two to about ten carbon atoms which is different than R.

An oligomeric N-alkyl perhydridosilazane according to a second embodiment of the invention has formula (4):

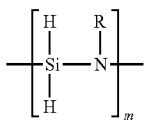
(4)

wherein R is a linear or branched alkyl group having two to about ten carbon atoms and m is an integer of about 3 to about 50.

In a further embodiment, the invention is directed to N-alkylaminodihydridohalosilanes having Formula (5):

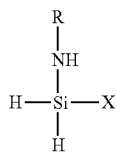
(5)

wherein R is a linear or branched alkyl group having two to about ten carbon atoms and X is a halogen.

BRIEF DESCRIPTION OF THE SEVERAL VIEWS OF THE DRAWINGS

The following detailed description of preferred embodiments of the present invention will be better understood when read in conjunction with the appended drawing. For the purposes of illustrating the invention, there is shown in the drawing an embodiment which is presently preferred. It is understood, however, that the invention is not limited to the precise arrangements and instrumentalities shown. In the drawings:

FIG. 2 is a TGA thermogram of poly(N-isopropylhydridosilazane).

DETAILED DESCRIPTION OF THE INVENTION

Figure 1:
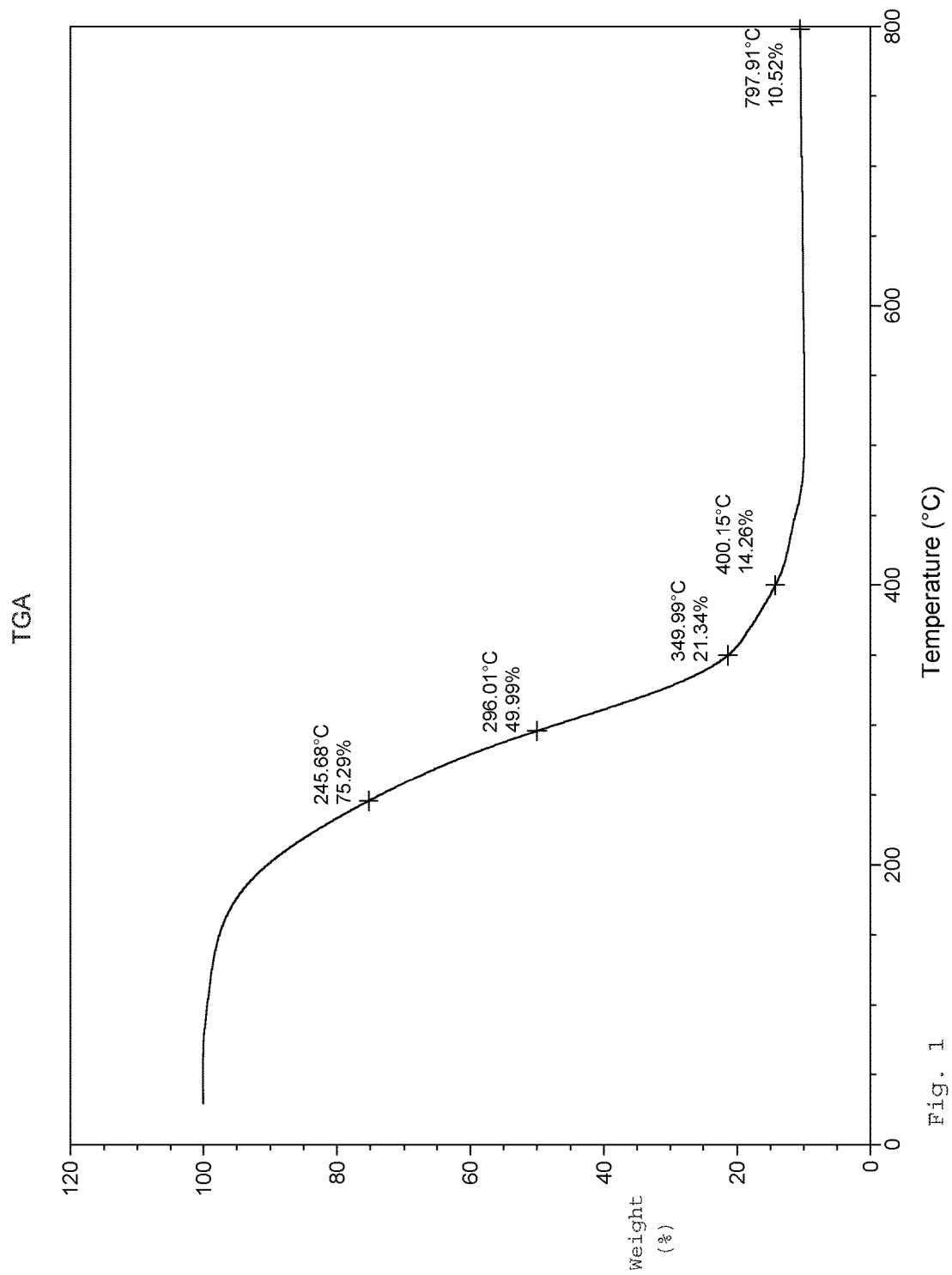
FIG. 1 is a TGA thermogram of poly(N-ethylhydridosilazane)

The present invention is directed to a new class of precursors for silicon nitride which may generally be described as N-alkyl substituted perhydridocyclic silazanes, more specifically N-alkyl substituted perhydridocyclotrisilazanes and N-alkyl substituted perhydridocyclotetrasilazanes. These compounds have the structures shown in Formulas (1), (2), and (3):

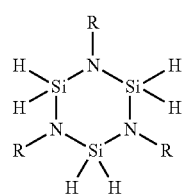
(1)

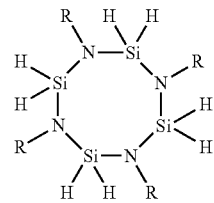
(2)

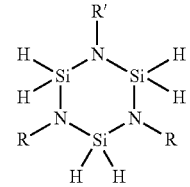
(3)

In Formulas (1), (2), and (3), each R is independently a branched or linear alkyl group having two to about ten carbon atoms, preferably about two to four carbon atoms, and is most preferably ethyl, propyl, butyl, isopropyl, or t-butyl. In Formula (3), R' is hydrogen or a branched or linear alkyl group having two to about ten carbon atoms, preferably about two to four carbon atoms, and is most preferably ethyl, propyl, butyl, isopropyl, or t-butyl, but must be different from R. Thus, the silazane having Formula (3) contains different substituents on the nitrogen atoms.

Salient features of the inventive compounds are that there are no organic substituents on the silicon atoms and that organic substituents (alkyl groups) with a minimum carbon number of two are present on most, if not all, of the nitrogen atoms. The inventive compounds are stable, non-pyrophoric materials which are capable of forming silicon nitride films.

Exemplary compounds according to the invention include 1,3,5-triethylcyclotrisilazane, 1,3,5,7-tetraethylcyclotetrasilazane, 1,3,5-tri(isopropyl)cyclotrisilazane, and 1,3,5-tri(tert-butyl)cyclotrisilazane, which have the following structures:

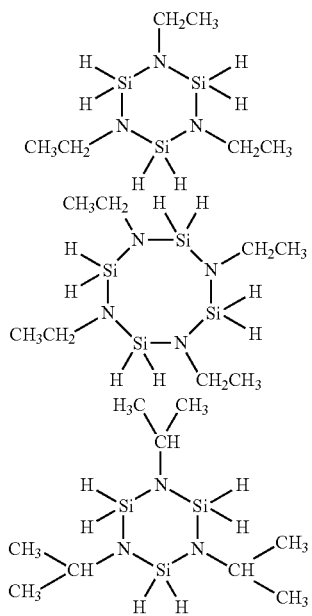
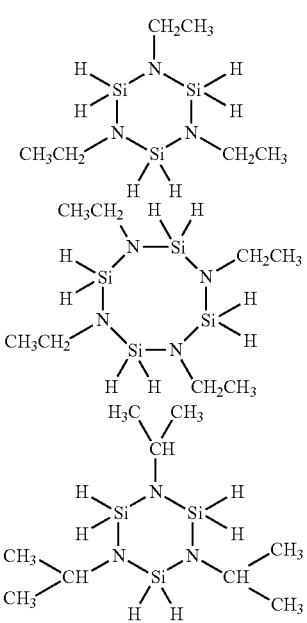

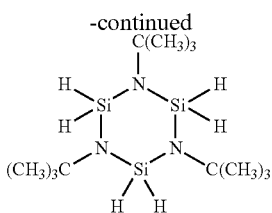

However, the invention is not limited to these compounds.

In contrast with known perhydridocyclic silazanes with methyl substituents on the nitrogen atoms, the presence of organic radicals (alkyl groups) with at least two carbon atoms provides a mechanism for low temperature deposition by elimination of ethylene, propylene, or isobutylene for ethyl, isopropyl/propyl, and t-butyl substitution, respectively. In contrast, the methyl substitution in the prior art compounds does not allow for such a low temperature deposition by elimination.

The invention also relates to oligomeric N-alkyl perhydridosilazanes having Formula (4).

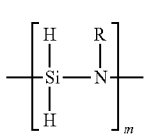

(4)

In Formula (4), R is a linear or branched alkyl group having two to about ten carbon atoms, more preferably two to about four carbon atoms, most preferably ethyl, isopropyl, or t-butyl, and m is an integer of about 3 to 50. Exemplary compounds of this type include poly(N-isopropylsilazane), poly(N-ethylsilazane), and 1,3,5-tri-(tert-butyl)-trisilazane.

Having two hydrogen atoms on each of the silicon atoms in the oligomeric compounds is significant because it facilitates the dissociative adsorption of hydrogen ($H_2$) upon interaction of the precursor with a surface. This is depicted for the case of N-ethylsilazane, which, under optimum conditions with ammonia as a component in the carrier gas stream, could decompose cleanly according to the following equation:

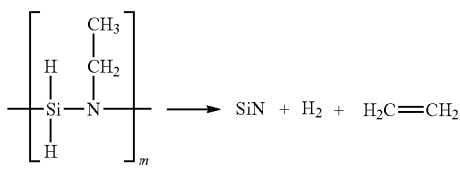

Depending on the temperature and conditions, small amounts of hydrogen and carbon may be incorporated into the film to form so-called "silicon carbonitride" as shown:

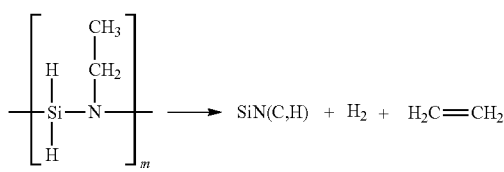

Thus, the materials of this invention offer the advantages of volatility, stability, non-pyrophoric nature, being free of halogens, and the ability to decompose at relatively low temperatures, preferably about 400° C. to about 650° C., to silicon nitride with minimal incorporation of carbon.

The invention also relates to a method for forming the N-alkyl substituted perhydridocyclic silazanes and the oligomeric N-alkyl perhydridosilazanes according to the invention. The method involves reacting a primary alkylamine with a dihalosilane at low temperature, preferably less than about −10° C., more preferably about −30 to about −40° C. Alkylamines which may be used in the method of the invention include any primary amine other than methylamine; the specific amine is selected based on the desired product. Appropriate dihalosilanes include dichlorosilane, dibromosilane, and diiodosilane. The appropriate dihalosilane may be selected by evaluating cost and deposition temperature considerations.

For example, isopropylamine may be reacted with 1 mol of dichlorosilane at −40° C. The intermediate (N-isopropylamino)chlorosilane is observed in reaction mixture samples withdrawn at low temperatures and immediately analyzed by GC mass spectroscopy. The reaction mixture is then reacted with more isopropylamine at room temperature and agitated at that temperature for 2-24 hours. The product, 1,3,5-triisopropylcyclotrisilazane, is isolated by filtration and low-temperature vacuum distillation.

While the cyclic trisilazane is the main product observed when the amine contains sterically hindered groups such as isopropyl, cyclic tetrasilazane and oligomeric/polymeric homologs, such as those shown below, are also isolated when linear amines such as ethylamine are employed as starting materials.

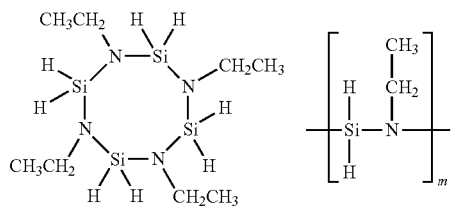

Accordingly, the method of the invention for producing N-alkyl substituted perhydridocyclic silazanes also results in the formation of the oligomeric N-alkyl perhydridosilazanes according to the invention.

The intermediates formed during the syntheses described above also have potential as precursors for low temperature deposition of silicon nitride films. These N-alkylaminodihydridohalosilanes have Formula (5), in which X is a halogen and R is a linear or branched alkyl group having two to about ten carbon atoms, preferably about two to four carbon atoms, and is most preferably ethyl, propyl, butyl, isopropyl, or t-butyl.

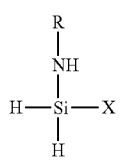

(5)

These compounds include (N-ethylamino)chlorosilane, (N-isopropylamino)chlorosilane, (N-t-butylamino)chlorosilane, (N-isopropylamino) bromosilane, and (N-t-butylamino)iodosilane. In the synthesis of the more sterically hindered t-butylcyclictrisilazane, the intermediate (N-t-butylamino)chlorosilane shown below is relatively stable and the ring-closure is accomplished by addition of diisobutylaluminum hydride in slight molar excess.

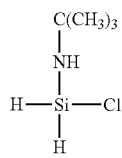

As previously explained, the compounds according to the invention are useful as precursors for forming high silicon nitride content films. Accordingly, the invention also relates to high silicon nitride content films formed by the thermal- or plasma-induced decomposition of the N-alkyl substituted perhydridocyclic silazanes, the oligomeric N-alkyl perhydridosilazanes, and the N-alkylaminodihydridohalosilanes according to the invention. For the purposes of this disclosure, the phrase "high silicon nitride content film" may be understood to mean a film which contains less than about 20 atom % carbon and hydrogen. It is known that residual hydrogen may remain on either the silicon or nitrogen atoms. This in turn is dependent on whether the deposition carrier gas is argon, nitrogen or ammonia. Typically, when the carrier gas is ammonia, carbon content is lower but hydrogen content is higher.

The invention will now be described in conjunction with the following, non-limiting examples.

EXAMPLE 1

Syntheses of 1,3,5-Triethylcyclotrisilazane, 1,3,5,7-Tetraethylcyclotetrasilazane, and Poly(N-ethylsilazane)

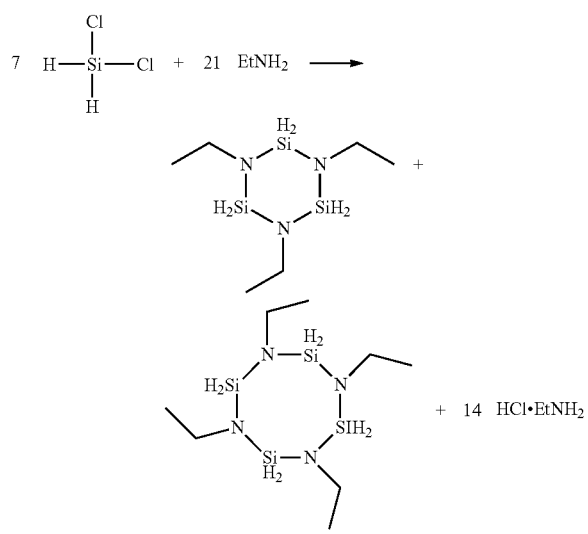

Under an argon atmosphere, a 5-liter 4-necked flask equipped with a cooling bath, overhead stirrer, pot thermometer, sub-surface dip-tube, and dry-ice condenser was charged with methyl t-butyl ether (2464.2 g). The mixture was cooled to −40° C. and dichlorosilane (5.35 mol, 540.4 g) was slowly added into the flask. Ethylamine (10.70 mol, 482.4 g) was then added via dip-tube between −30 and −20° C. A precipitate formed immediately and an exotherm was observed. The addition of ethylamine was completed over 2.5 hours. After addition was completed, the reaction mixture was slowly warmed to 25° C. and stirred at this temperature for 6-12 hours. The reaction mixture as cooled to 0° C. Additional ethylamine (2.93 mol, 132.2 g) was added to the reaction mixture, maintaining temperature between 0° C. and 40° C. over 2.0 hours A second portion of methyl t-butyl ether (308.0 g) was added to facilitate agitation. The mixture was stirred for 8 to 14 hours at room temperature and monitored by GC. Subsequently, the reaction mixture was filtered and solvents were removed from the filtrate under reduced pressure, maintaining pot temperature below 50° C. After the reaction mixture was filtered again, GC analysis indicated an estimated yield of two cyclic species of ~60%. Fractional distillation of the clear filtrates afforded 94.4 g (23.8% yield) of 1,3,5-triethylcyclotrisilazane: b.p. 40-42° C./0.7 mmHg, density@20° C.: 0.934, FTIR vSi—H: 2098 9(vs) and $^1$HNMR (CDCl$_3$):1.16 (t, 9H), 2.98 (q, 6H) and 4.72 (s, 6H). 58.2 g (15.0% yield) of 1,3,5,7-tetraethylcyclotetrasilazane: b.p. 83-5° C./1.5 mmHg, density@20° C.: 0.938 FTIR vSi—H: 2098 9(vs) and $^1$HNMR(CDCl$_3$):1.17 (m, 9H), 3.00 (m, 6H) and 4.75 (d, 6H). A non-volatile oligomeric product was also isolated in ~20% yield with a molecular weight (Mn by GPC) between 1500 and 2000, corresponding to approximately 25 repeat units. IR and NMR spectra of this product were consistent with the structure of poly(N-ethylsilazane):

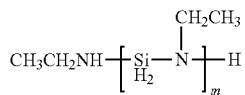

EXAMPLE 2

Syntheses of 1,3,5-tri-(isopropyl)cyclotrisilazane and poly(N-isopropylsilazane)

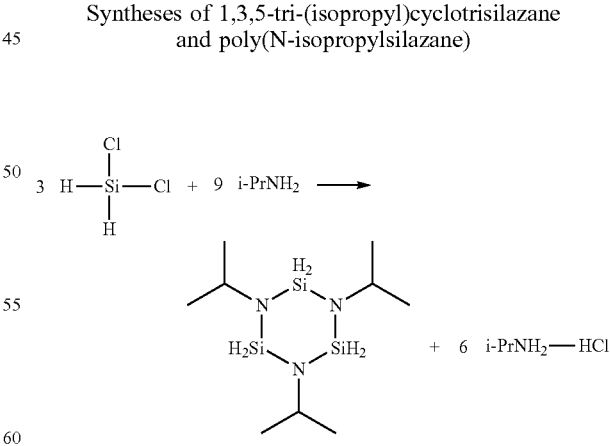

Under an argon atmosphere, a 5-liter 4-necked flask equipped with a cooling bath, overhead stirrer, pot thermometer, sub-surface dip-tube, and dry-ice condenser was charged with methyl t-butyl ether (909 g). The mixture was cooled to −40° C. and dichlorosilane (3.0 mol, 303.0 g) was slowly added to the pot. Isopropylamine (6.0 mol, 354.7 g)

was then added via dip-tube between −30 and −20° C. over 2.5 hours. After addition was completed, the reaction mixture was slowly warmed to 25° C. and stirred at this temperature for 8-14 hours. Additional isopropylamine (3.0 mol, 177.4 g) was added to the reaction mixture between 0° C. and 40° C., followed by addition of 2$^{nd}$ portion of methyl t-butyl ether (227.3 g). The mixture was stirred for 6-16 hours and monitored by GC. The reaction mixture was filtered and solvents were removed from the filtrates under reduced pressure below 50° C. The reaction mixture was filtered again and fractional distillation of the clear filtrates afforded 64.5 g (24.66) of 1,3,5-tri-(N-isopropyl)cyclotrisilazane: b.p. 67-8° C./1.8 mmHg, density@20° C.: 0.919, FTIR: vS—H:2113.6 (vs) and $^1$HNMR (CDCl$_3$):1.29 (d, 18H), 3.38 (m, 3H) and 4.80 (s, 6H). A non-volatile oligomeric product was also observed in ~10% yield with a molecular weight (Mn by GPC) between 800 and 1200, corresponding to approximately 12 repeat units. IR and NMR were consistent with the structure of poly(N-isopropylsilazane):

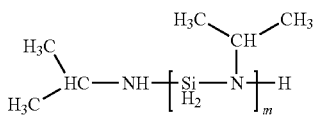

EXAMPLE 3

Synthesis of tert-butylaminochlorosilane

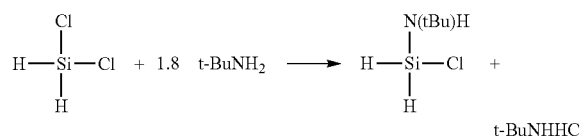

Under an argon atmosphere, a 5-liter 4-neck flask equipped with a cooling bath, overhead stirrer, pot thermometer, addition funnel, and dry-ice condenser was charged with dichlorosilane in di-n-butyl ether (2.77 mol, 1120 g, 25 wt %). The reactor was cooled to −40° C. and tert-butylamine (5.0 mol, 364.9 g) was slowly added via addition funnel between −30 and −20° C. over 2.5 hours. After addition was complete, the reaction mixture was warmed to 20 to 30° C. and stirred for 24 hours at this temperature. Product was stripped from the pot below 40° C. while reducing pressure from 760 to 0.5 mmHg to give 1319.4 g of crude product. The crude product was maintained as a solution in di-n-butylether 186.5 g (54% yield). GC-mass spec confirmed the structure with parent and fragment ions as 122(M$^+$, 100%), 86(t-BuNHSiH$^+$, 26%), FTIR vSi—H: 2199.0 (s).

EXAMPLE 4

Synthesis of 1,3,5-tri-(tert-butyl)cyclotrisilazane

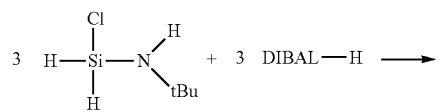

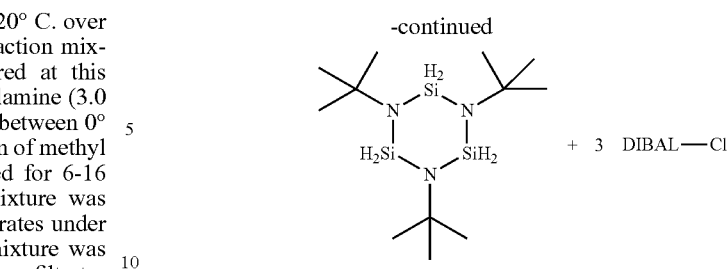

Under an argon atmosphere, a 1-liter 4-necked flask equipped with a cooling bath, magnetic stirrer, pot thermometer, addition funnel, and dry-ice distill head was charged with t-butylaminochlorosilane crude contained in di-n-butyl ether (0.38 mol, 52.3 g) from Example 3. The mixture was cooled to −10° C. and diisobutylaluminum hydride (DIBAL-H) (0.478 mol, 67.9 g) was added via addition funnel between −5° C. and 30° C. over 3 hours. Upon completion of the addition, the pot temperature was slowly increased to 80° C. Pressure was reduced from 760 to 1 mmHg in order to remove lights. Redistillation of product crude under reduced pressure provided 12.5 g (14% yield) of the title compound, b.p. 74-76° C./0.4 mmHg, density@20° C.: 0.904, FTIR: vS—H:2121.5 (vs) and $^1$HNMR (CDCl$_3$): 1.32 (s, 27H) and 4.98 (s, 6H).

EXAMPLE 5

Synthesis of 1,3,5-Tri-(tert-butyl)-trisilazane

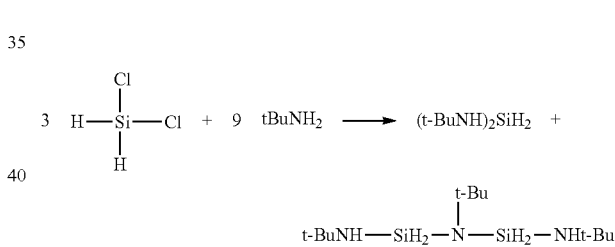

Under an argon atmosphere, a 5-liter 4-necked flask equipped with a cooling bath, overhead stirrer, pot thermometer, sub-surface dip-tube, and dry-ice condenser was charged with methyl t-butyl ether (1144.3 g). The mixture was cooled to −40° C. and dichlorosilane (2.5 mol, 252.5 g) was slowly added to the pot. t-Butylamine (7.5 mol 548.6 g) was then added via dip-tube between −30 to −20° C. over 2.5 hours. After addition was completed, the reaction mixture was slowly warmed to 25° C. and stirred at this temperature for 24 hours. Additional t-Butylamine (3.75 mol, 274.3 g) was added to the reaction mixture between 0 and 40° C. The mixture was stirred for 3 hours and monitored by GC. The reaction mixture was filtered and solvents were removed from the filtrates under reduced pressure below 50° C. The reaction mixture was filtered again and fractional distillation of the clear filtrates afforded 107.5 g (14.0 mol) of Bis(t-butylamino)silane and 31.2 g of 1,3,5-Tri-(tert-butyl)-trisilazane: b.p. 62-3° C./0.3 mmHg, density@20° C.:0.868, FTIR: vS—H:2140.9 (vs) and 1HNMR(CDCl3):1.19 (s, 18H), 1.37 (s, 9H) and 4.73 (s, 4H).

EXAMPLE 6

Thermogravimetric Analysis

The thermal decomposition properties of poly(N-isopropylhydridosilazane) (Example 2) and poly(N-ethylhydridosilazane) (Example 1) were evaluated by thermogravimetric analysis at 5° C./minute under nitrogen and demonstrate the conversion to silicon nitride. As shown in FIGS. 1 and 2, analysis of both residues residue (after 800° exposure), excluding hydrogen was greater than 90% Si and N, with less than 10% carbon.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. An N-alkyl substituted perhydridocyclic silazane having Formula (1),

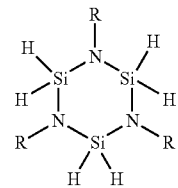

(1)

wherein each R is independently a branched alkyl group having three to ten carbon atoms.

2. The silazane according to claim 1, wherein the silazane is 1,3,5-tri-(isopropyl)cyclotrisilazane.

3. The silazane according to claim 1, wherein the silazane is 1,3,5-tri-(tert-butyl)cyclotrisilazane.

4. A method of producing an N-alkyl substituted perhydridocyclic silazane according to claim 1, comprising reacting a branched alkyl amine with a dihalosilane at a temperature of less than about −10° C.

5. The N-alkyl substituted perhydridocyclic silazane according to claim 1, wherein each R is independently selected from the group consisting of isopropyl and t-butyl groups.

* * * * *